(12) United States Patent
Solomko et al.

(10) Patent No.: US 9,947,985 B2
(45) Date of Patent: Apr. 17, 2018

(54) SYSTEM AND METHOD FOR A DIRECTIONAL COUPLER

(71) Applicant: Infineon Technologies AG, Neubiberg (DE)

(72) Inventors: Valentyn Solomko, Munich (DE); Winfried Bakalski, Munich (DE); Nikolay Ilkov, Munich (DE)

(73) Assignee: Infineon Technologies AG, Neubiberg (DE)

( * ) Notice: Subject to any disclaimer, the term of this patent is extended or adjusted under 35 U.S.C. 154(b) by 94 days.

(21) Appl. No.: 14/804,073

(22) Filed: Jul. 20, 2015

(65) Prior Publication Data

US 2017/0026020 A1  Jan. 26, 2017

(51) Int. Cl.
H01P 5/18 (2006.01)
H03H 7/38 (2006.01)
H03H 7/48 (2006.01)

(52) U.S. Cl.
CPC .............. H01P 5/184 (2013.01); H03H 7/48 (2013.01)

(58) Field of Classification Search
CPC .................................... H01P 5/18; H03H 7/40
USPC ................................ 333/109–112, 116, 17.3
See application file for complete search history.

(56) References Cited

U.S. PATENT DOCUMENTS

| | | | | |
|---|---|---|---|---|
| 4,122,400 A | * | 10/1978 | Medendorp | H03F 1/52 330/207 P |
| 5,038,112 A | * | 8/1991 | O'Neill | H03G 7/00 330/207 P |
| 5,745,016 A | * | 4/1998 | Salminen | G01R 1/24 324/95 |
| 6,329,880 B2 | * | 12/2001 | Akiya | H03F 1/0261 330/207 P |
| 8,095,085 B2 | * | 1/2012 | Song | H03J 3/06 455/107 |
| 8,175,554 B2 | * | 5/2012 | Camuffo | H03G 3/3042 455/126 |
| 8,412,121 B2 | * | 4/2013 | Bonnet | H01Q 1/241 343/700 MS |
| 8,432,234 B2 | * | 4/2013 | Manssen | H03H 7/40 333/17.3 |
| 8,446,256 B2 | | 5/2013 | Pinkham | |
| 8,466,756 B2 | * | 6/2013 | Milosavljevic | H04B 1/0458 333/17.3 |
| 8,471,568 B2 | * | 6/2013 | Charley | H04B 1/0458 324/649 |
| 8,803,631 B2 | * | 8/2014 | Manssen | H03H 5/12 333/32 |
| 2010/0022203 A1 | * | 1/2010 | Bonnet | H01Q 1/241 455/84 |

(Continued)

Primary Examiner — Dean Takaoka
(74) Attorney, Agent, or Firm — Slater Matsil, LLP

(57) ABSTRACT

In accordance with an embodiment, a method of operating a directional coupler includes determining a coupled power variation by applying an input signal at an input port of the directional coupler, applying a first impedance at a transmitted port of the directional coupler, measuring a first coupled power at a coupled port of the directional coupler after applying the first impedance, applying a second impedance at the transmitted port of the directional coupler, measuring a second coupled power after applying the second impedance, and determining a difference between the first coupled power and the second coupled power to form the coupled power variation.

28 Claims, 14 Drawing Sheets

(56) References Cited

U.S. PATENT DOCUMENTS

| | | | |
|---|---|---|---|
| 2012/0026063 A1* | 2/2012 | Lee | H03H 7/40 343/860 |
| 2013/0027129 A1* | 1/2013 | Langer | H04B 1/0458 330/127 |
| 2013/0201882 A1* | 8/2013 | Bauder | H03H 7/48 370/277 |
| 2013/0241664 A1* | 9/2013 | McKinzie, III | H03H 7/40 333/17.3 |
| 2015/0002146 A1 | 1/2015 | Solomko et al. | |

* cited by examiner

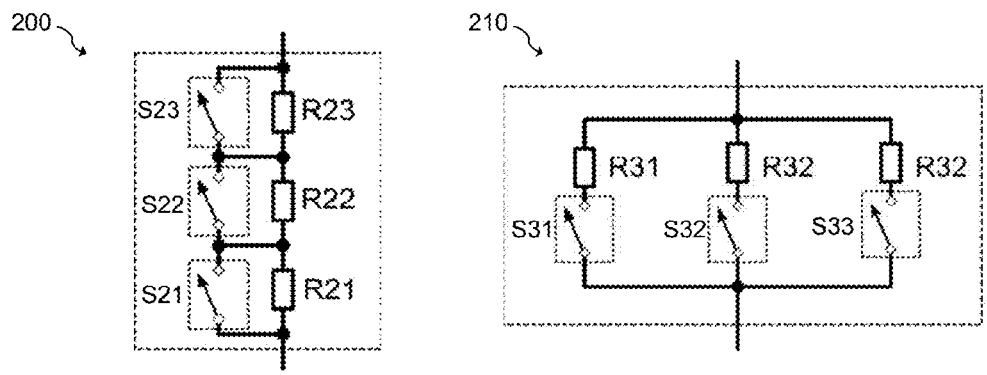
*FIG. 5a*  *FIG. 5b*
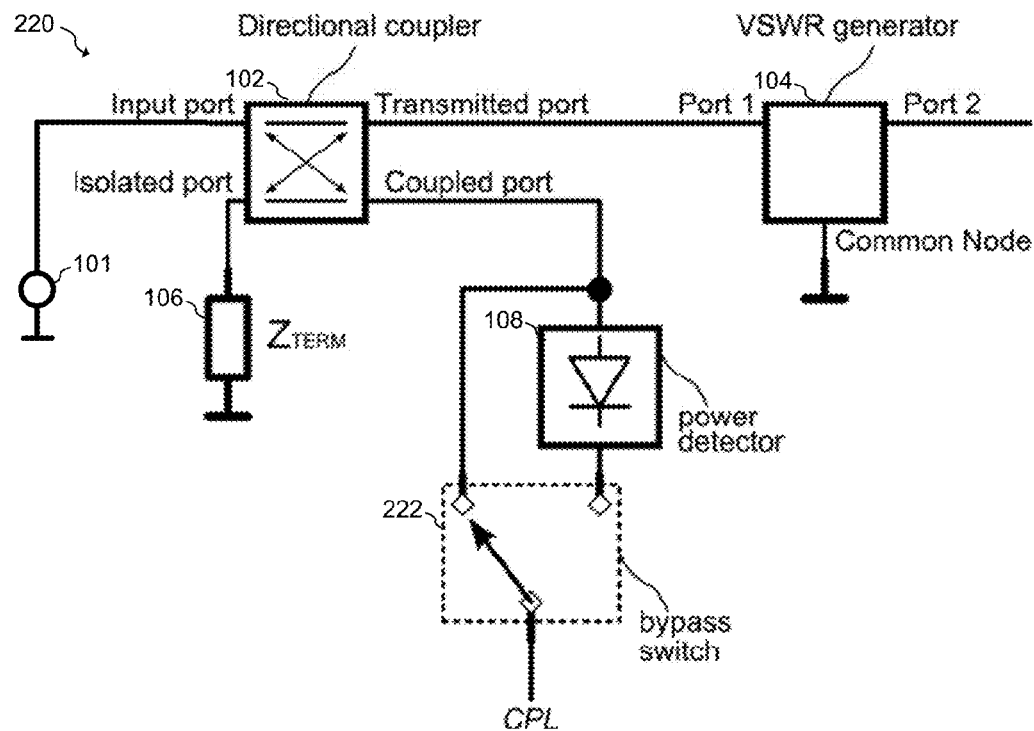
*FIG. 6*

US 9,947,985 B2

SYSTEM AND METHOD FOR A DIRECTIONAL COUPLER

TECHNICAL FIELD

The present disclosure relates generally to an electronic device, and more particularly to a system and method for a directional coupler.

BACKGROUND

Directional couplers, which are electronic devices that can detect power being transmitted in a particular direction, are used in a wide variety of radio frequency (RF) circuits. For example, a directional coupler may be used in a radar system to detect a reflected wave by separating the incident wave from the reflected wave, or may be used in a circuit that measures the impedance mismatch of transmission lines. Functionally, a directional coupler has a forward transmission path and a coupled transmission path. The forward transmission path generally has a low loss, while the coupled transmission path couples a fraction of the transmission power that is propagated in a particular direction. There are many different types of coupler architectures that include electromagnetic couples and magnetic couplers. Each of these coupler types may be implemented using different topologies and materials depending on the frequency of operation and the operational environment.

One common application for a directional coupler is the detection of the reflected and transmitted power in a portable radio frequency (RF) device such as a cellular telephone or a portable computing device. The measurement of the transmitted power may be used in a control loop to adjust the output of a power amplifier, while the measurement of the reflected power may be used to adjust adjustable antenna matching networks. As portable RF devices become more sophisticated with respect to being able to operate over multiple frequencies using multiple standards, the topologies of the RF ends have become more complicated. For example, a multi-standard RF device may have multiple transmit and receive paths coupled to one or more antennas via a network of multiple switches, matching networks, power detectors and the like. Accordingly, the layout and construction of such portable RF devices often consume a considerable amount of printed circuit board (PCB) space.

SUMMARY

In accordance with an embodiment, a method of operating a directional coupler includes determining a coupled power variation by applying an input signal at an input port of the directional coupler, applying a first impedance at a transmitted port of the directional coupler, measuring a first coupled power at a coupled port of the directional coupler after applying the first impedance, applying a second impedance at the transmitted port of the directional coupler, measuring a second coupled power after applying the second impedance, and determining a difference between the first coupled power and the second coupled power to form the coupled power variation.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5a and 5b illustrate adjustable impedance circuits;

FIG. 6 illustrates an embodiment directivity measurement system having a bypass switch;

Figure 1A:
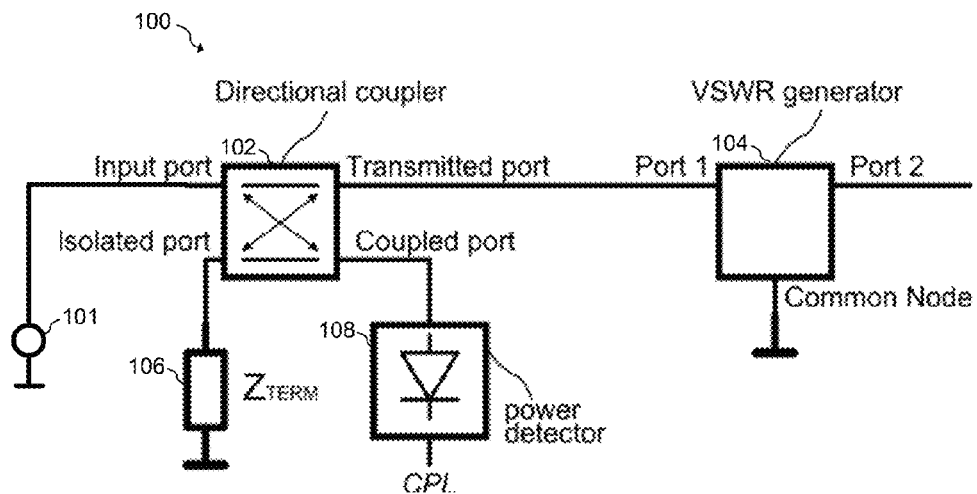
FIGS. 1a-1c illustrates an embodiment directional coupler system, an illustrative waveform diagram related to the embodiment directional coupler system, and a flowchart of an embodiment method of measuring the performance of the embodiment directional coupler system.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a directional coupler that may be used, for example, in RF circuits to measure incident or reflected power. Embodiments of the present invention may also be applied to other systems and applications, for example, other circuits having directional couplers and RF systems with selectable signal paths. Moreover, embodiments may be directed to systems that make RF measurements including, but not limited to devices that measure and/or tune impedance mismatch, time domain reflectometers (TDR), sensing devices for use with tunable antenna matching circuits, and tunable filters.

A well-known challenge in monolithically integrated coupler design is to obtain sufficiently high directivity. A further challenge is to provide high directivity over process variations that exist in integrated circuit technologies. In embodiments of the present invention, the directivity of a directional coupler is measured and parameters of the directional coupler are adjusted such that an adverse influence of process uncertainties is calibrated out such that high directivity is achieved.

In an embodiment, a directional coupler is loaded with a switchable impedance that creates a highly mismatched load condition for the directional coupler. The coupling factor is measured at different values of VSWR at the transmit port of the coupler and variation in the coupled power is detected. As the measured variation in measured power is proportional to the directivity, the coupler is calibrated such to achieve minimum variation of the coupled power in some embodiments.

One example of an embodiment system includes a directional coupler, a switchable impedance or a VSWR generator coupled to a transmitted port of the directional coupler and a power detector coupled to a coupled port of the directional coupler. In some embodiments, the switchable impedance or VSWR generator is implemented using of series and shunt RF switches generating load, short and/or open conditions for the directional coupler during calibration.

In an embodiment of the present invention, a directivity of a directional coupler is determined by introducing a test signal at an input port of the directional coupler and taking two measurements at a coupled port of the directional coupler. The first measurement is made when the output, or transmitted port of the directional coupler is loaded with a first impedance, and the second measurement is made when the output or transmitted port of the directional coupler is loaded with a second impedance. This directivity measurement may be used, for example, to calibrate adjustable termination resistors connected to various ports of the directional coupler such that the directivity of the directional coupler is maximized or increased.

Embodiment directional coupler systems may be used, for example, in RF front-end systems and front-end multi-chip modules for cellular handsets, and the various embodiments combine outputs of single or multiple directional couplers into a single output using RF switches. Such directional coupler systems, for example, may be specifically used in reconfigurable RF front-ends for cellular handsets. In some embodiments, directional coupler systems that utilize directional couplers, RF switches and attenuators may be used in RF front-end systems to sense the power transmitted from PA to an antenna and the power reflected from the antenna back to PA due to impedance mismatch at the various ports in the system.

FIG. 1a illustrates a directional coupler system 100 according to an embodiment of the present invention. As shown, directional coupler system 100 includes directional coupler 102, VSWR generator 104 coupled to the transmitted port of directional coupler 102, power detector 108 coupled to the coupled port of directional coupler 102 and termination impedance 106 coupled to the isolated port of directional coupler 102. Test signal generator 101 may be used to introduce an RF signal at the input port of directional coupler 102. In accordance with various embodiments, directional coupler 102 may be implemented using directional coupler circuits known in the art. For example, directional coupler 102 may be implemented using a transformer based directional coupler, a stripline directional coupler, or another type of directional coupler known in the art. In some embodiments, directional couplers may be used that are disclosed in U.S. patent application Ser. No. 14/155,130 entitled, "System and Method for a Directional Coupler," filed on Jan. 14, 2014, which application is incorporated by reference in its entirety. Power detector 108 may be implemented using RF power detection circuits and systems known in the art.

Generally, the higher the directivity of a directional coupler, the less sensitive the directional coupler will be to variations in impedance at its transmitted port. Accordingly, this property may be used to measure the directivity of directional coupler 102 and to calibrate the directivity of directional coupler 102 by adjusting termination impedance 106. In an embodiment, a directivity measurement is made by introducing a test signal at the input port of directional coupler 102 and measuring the power at the coupled port using power detector 108 under two different load conditions or termination impedances produced by VSWR generator 104.

The coupling factor of a directional coupler is defined as:

$$CPL = P_{input,dB} - P_{coupled,dB} \quad (1)$$

where $P_{input,dB}$ is the input power and $P_{coupled,dB}$ is the coupled power. The deviation of coupling factor for two different termination impedances is defined as:

$$\delta = CPL_1 - CPL_2 \quad (2)$$

where $CPL_1$ is a coupling factor for the first value of termination impedance at the transmitted port and $CPL_2$ is a coupling factor for the second value of termination impedance at the transmitted port.

Figure 1C:
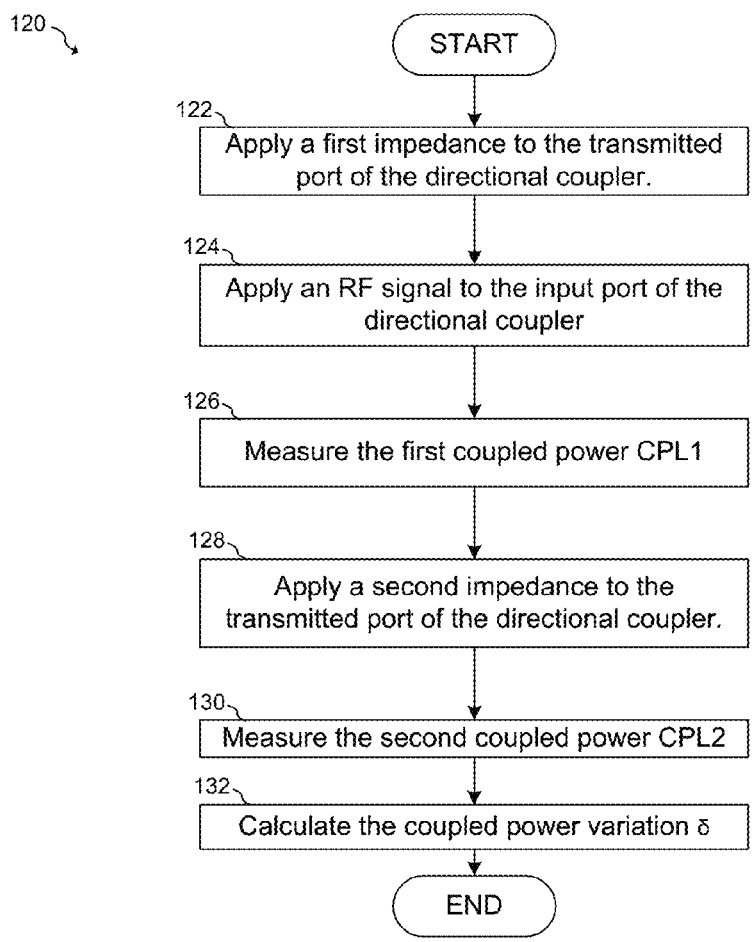
Figure 1B:
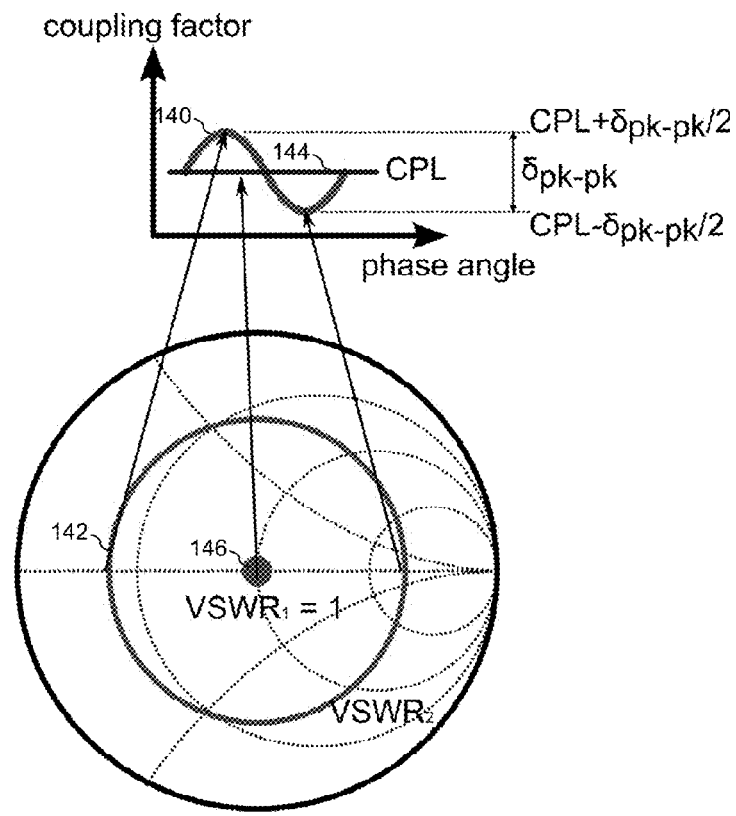

FIG. 1b illustrates the effect of matched and mismatched conditions on a directional coupler. The illustrated Smith chart has point 146 that corresponds to a matched impedance condition with $VSWR_1=1$ and has trace 142 that corresponds to a mismatched impedance condition having $VSWR_2$ and a reflection coefficient $|\Gamma_L|$ such that $$|\Gamma_L| = \frac{VSWR_2 - 1}{VSWR_2 + 1}, \quad (3)$$

With respect to FIG. 1a, this $VSWR_2$ is the voltage standing wave ratio seen at port 1 of VSWR generator 1-4. As shown in the coupling factor vs. phase angle plot, trace 144 representing the coupling factor that corresponds to the matched condition is constant over phase angle, whereas trace 140 representing the mismatched condition varies over phase angle with a peak-to-peak magnitude of $\delta_{pk-pk}$. This peak-to-peak magnitude of $\delta_{pk-pk}$ may be expressed in terms of reflection coefficient $|\Gamma_L|$ and coupler directivity DIR as follows:

$$\delta_{pk-pk} = 20\log\frac{1 + \frac{|\Gamma_L|}{10^{DIR/20}}}{1 - \frac{|\Gamma_L|}{10^{DIR/20}}}, \text{dB} \quad (4)$$

Using equations (3) and (4) the directivity DIR can be expressed with respect to the VSWR and $\delta_{pk-pk}$ as follows:

$$DIR = 20\log\left(\frac{VSWR - 1}{VSWR + 1} \cdot \frac{10^{\frac{\delta_{pk-pk}}{20}} + 1}{10^{\frac{\delta_{pk-pk}}{20}} - 1}\right), \text{dB.} \quad (5)$$

FIG. 1c illustrates an embodiment method 120 of determining a coupled power variation δ. In step 122, a first impedance is applied to the transmitted port of directional coupler 102 via VSWR generator 104, and in step 124 an RF signal is applied to the input port of directional coupler 102. Next, a first coupled power CPL1 is measured via power detector 108 in step 126. After first coupled power CP1 is measured, a second impedance is applied to the transmitted port of directional coupler 102 via VSWR generator 104 in step 128 and a second coupled power CPL2 is measured in step 130 using power detector 108. In step 132, the coupled power variation δ is determined by finding the difference between CPL1 and CPL2.

There are a number of different choices with respect to the termination impedances generated by VSWR generator 104. In one embodiment both impedances may be chosen such that they cause the same VSWR but have different phases with respect to the reflection coefficient. For example, a high real impedance corresponding to a particular VSWR may be used as one impedance, and a lower real impedance corresponding to the same VSWR may be used for the other impedance. A further example of this is an RF short circuit and an RF open circuit. Alternatively, the two measurements may correspond to different VSWRs. For example the directional coupler may be terminated using a matched termination for $VSWR_1=1$ (e.g., using a 50Ω termination impedance in a 50Ω system) to measure a nominal coupling factor CPL, and then terminated with an impedance to produce a second $VSWR_2$ having a phase angle such that a maximum coupling factor deviation δpk=(δpk−pk)/2 is achieved. The directivity may then be calculated as follows:

$$DIR = 20\log\left(\frac{VSWR_2 - 1}{VSWR_2 + 1} \cdot \frac{10^{\frac{\delta_{pk}}{10}} + 1}{10^{\frac{\delta_{pk}}{10}} - 1}\right), dB. \quad (6)$$

In some embodiments, high values for $VSWR_2$ are used to minimize the error in calculated directivity if $VSWR_1$ is not exactly 1. In one embodiment, a shunt switch is used to generate VSWR2 and the ON-resistance of the shunt switch is made as low as possible, for example in the range of about 1Ω to 5Ω. Alternatively, other values for load impedances and VSWR may be used.

Figure 2A:
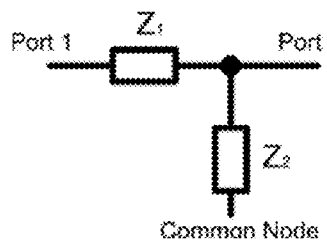
FIGS. 2a-2d illustrate an embodiment switchable impedance circuit.
Figure 2B:
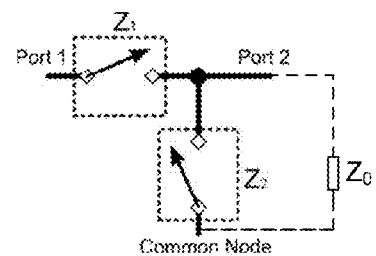
Figure 2C:
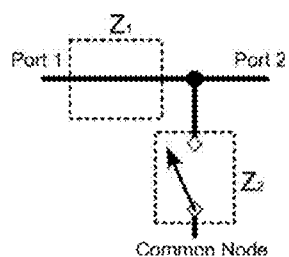
Figure 2D:
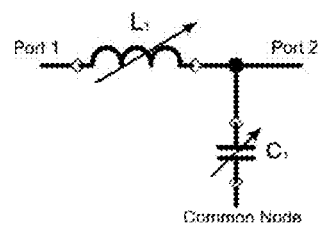

FIGS. 2a-2d illustrate various circuits that may be used to implement VSWR generator 104. For example, FIG. 2a illustrates a two-port VSWR generator having a first complex impedance $Z_1$ coupled between port 1 and port 2, and a second complex impedance coupled between port 2 and a common node. One or both of these complex impedances may be adjusted during a directivity measurement, as shown in FIGS. 2b-2d. In FIG. 2b, complex impedances $Z_1$ and $Z_2$ are each implemented using switches such that each complex impedance $Z_1$ and $Z_2$ may achieve either short circuit or an open circuit impedance. FIG. 2c illustrates complex impedance $Z_1$ implemented as a short circuit and complex impedance $Z_2$ implemented as a switch, and FIG. 2d illustrates complex impedance $Z_1$ implemented as adjustable inductor $L_1$ and complex impedance $Z_2$ implemented as an adjustable capacitor $C_1$.

In some embodiments, the switches shown in FIGS. 2c and 2d may be implemented using semiconductor switches such that the impedances of the open and closed switches are determined by the device parameters of the transistors used to implement the switches. In such embodiments, the switches will have an impedance that corresponds to an on-resistance of the transistor used to implement the switches when the switches are closed.

In an embodiment, the VSWR generation circuit of FIG. 2b may be used to measure the directivity of directional coupler 102 using three measurements as follows. In an embodiment, port 2 of the circuit of FIG. 2b is terminated with a matched impedance $Z_0$ such that $VSWR_1=1$. For example, a real impedance of 50Ω may be used in a 50Ω system. Accordingly, the transmitted port of directional coupler 102 is terminated with a matched impedance $Z_0$ by closing the switch associated with $Z_1$ and opening the switch associated with $Z_2$ and a nominal coupling factor CPL is measured via power detector 108. Next, a low termination impedance is generated by closing the switches associated with both $Z_1$ and $Z_2$, and a first deviation δpk1 from CPL is measured via power detector 108. Finally, a high termination impedance is generated by turning off the switch associated with $Z_1$ and a second deviation δpk2 from CPL is measured via power detector 108.

To calculate the directivity, equation (6) may be used to calculate a first directivity DIR1 based on first deviation δpk1 and to calculate a second directivity DIR2 based on second deviation δpk2. From directivities DIR1 and DIR2, an average directivity may be found as follows:

$$DIR = \frac{DIR1 + DIR2}{2}, dB. \quad (7)$$

By using an average directivity over a number of directivity measurements, the error in calculated directivity may be reduced. In alternative embodiments of the present invention, an arbitrary number of directivity measurements may be made over different load conditions to calculate an average directivity.

Figure 3A:
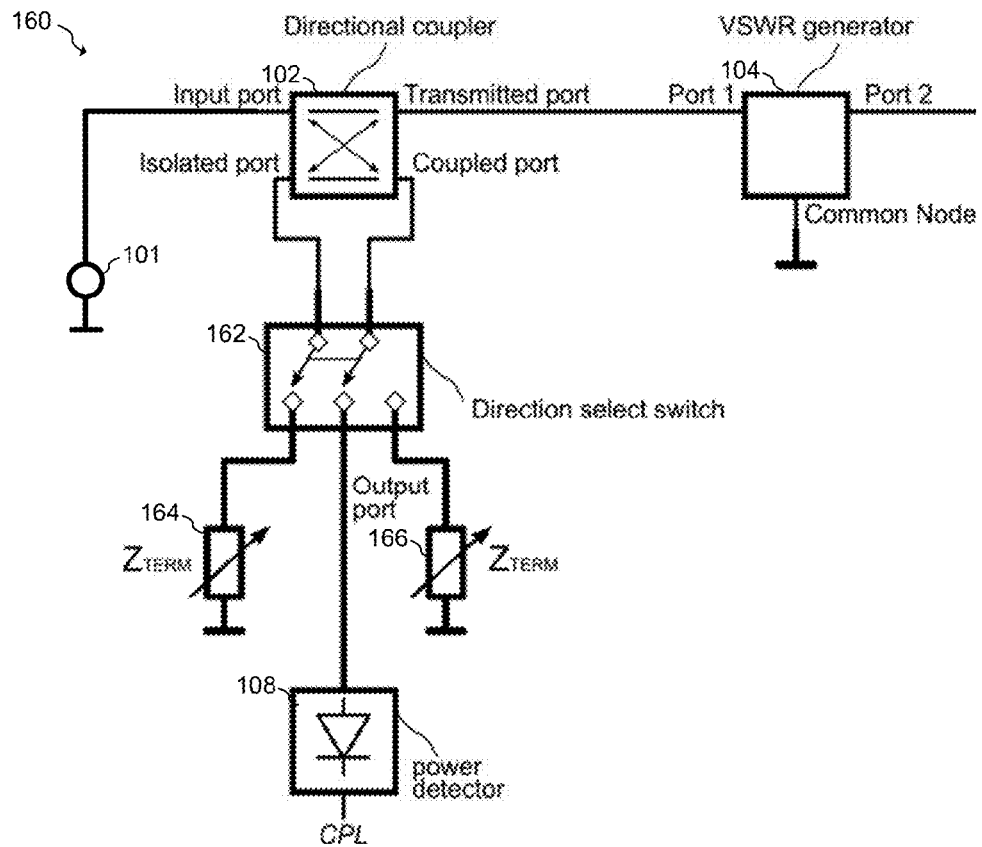
FIGS. 3a-3b illustrate an embodiment directional coupler system and a flowchart of an embodiment method of calibrating the embodiment directional coupler system.

FIG. 3a illustrates an embodiment directional coupler system that includes directional coupler 102, VSWR generator 104 and power detector 108 coupled to the isolated and coupled port via direction select switch 162. In an embodiment, direction select switch 162 is used to select either the isolated port or the coupled port of directional coupler 102. When direction select switch 162 selects the isolated port, the output of direction select switch 162 provides a signal that is proportional to an RF signal propagating from the transmitted port to the input port. Such a signal may result, for example, from reflected RF power. The signal may be to measure an impedance mismatch. Conversely, when direction select switch 162 selects the coupled port, the output of direction select switch 162 provides a signal that is proportional to an RF signal propagating from the transmitted port to the input port. Such a signal may be used to measure transmitted power. In an embodiment, directional coupler 102 and direction select switch 162 may be disposed on separate integrated circuits or may be monolithically integrated on a single die. Separate chips may be integrated in a multichip module or mounted on an application printed-circuit board.

Adjustable termination impedances 164 and 166 are also coupled to direction select switch 162 in order to provide a termination to directional coupler 102. When the coupled port is selected, the coupled port is routed to power detector 108 and the isolated port is routed to adjustable termination resistor 164. On the other hand, when the isolated port is selected, the coupled port is routed to adjustable termination resistor 166. Each of adjustable termination impedances 164 and 166 may be adjusted to increase and/or maximize the directivity of coupler 160.

Figure 3B:
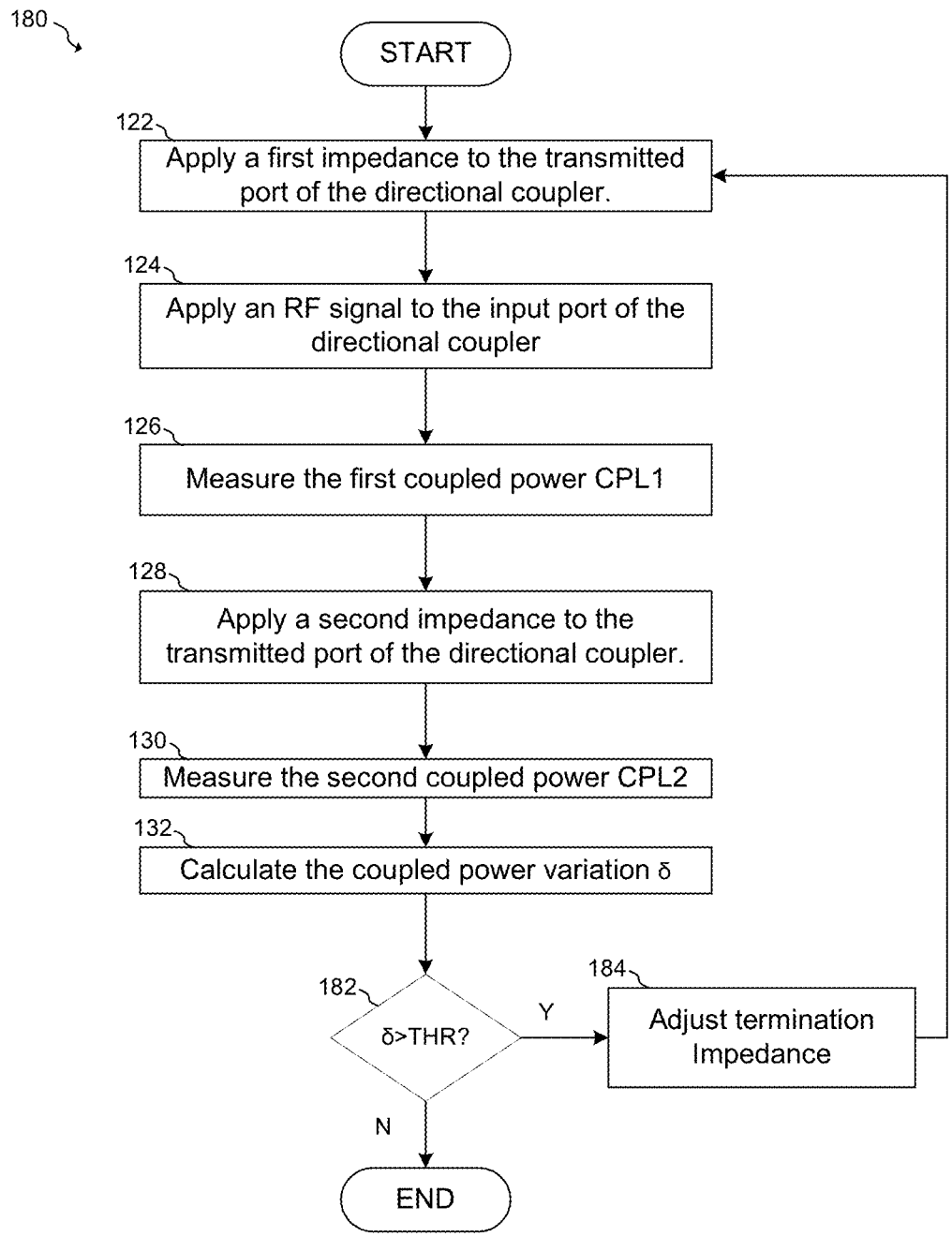

FIG. 3b illustrates an embodiment method 180 of determining a coupled power variation δ. Steps 122 to 132 are similar to steps 122 to 132 of method 120 illustrated in FIG. 1c and described above to measure the coupled power variation δ of directional coupler 102. Once the coupled power variation δ is determined by finding the difference between CPL1 and CPL2 in step 132, the coupled power variation δ is compared with a threshold THR in step 182. In some embodiments threshold THR is set to be between about 0.1 dB and about 1 dB. In alternative embodiments, thresholds outside of this range may be used depending on the particular embodiment and its specifications. In some embodiments, the absolute value of the coupled power variation δ may be compared to threshold THR. If the coupled power variation δ is greater than the threshold, then the termination impedance is adjusted in step 184 and steps 122 to 132 are repeated to once again measure directional coupler 102. When the coupled power variation δ is smaller than the threshold, the calibration procedure ends.

In alternative embodiments, other values besides coupled power variation δ may be used as a figure of merit for directional coupler 102 when measuring and calibrating the coupler. For example, a directivity DIR may be derived and compared to a threshold in step 182 using the various methods disclosed herein. In some embodiments, multiple measurements over various load conditions may be averaged to produce an average directivity.

Figure 4:
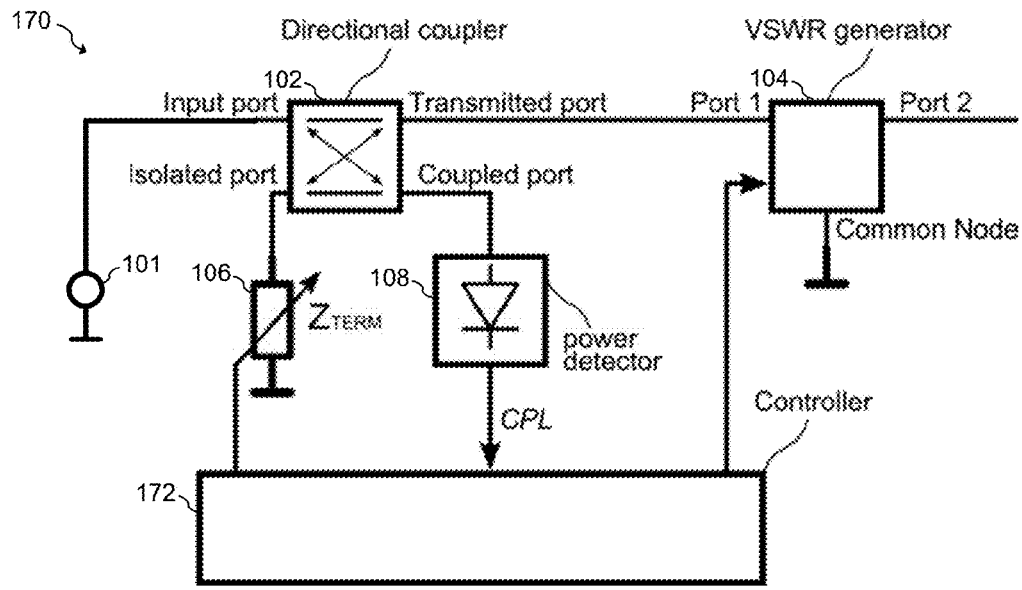
FIG. 4 illustrates an embodiment directional coupler system that includes a controller.

FIG. 4 illustrates directivity system 170 that includes the directivity system of FIG. 1*a* with the further addition of controller 172 that is coupled to power detector 108, adjustable termination impedance 106 and VSWR generator 104. In an embodiment, controller 172 is configured to control and sequence the measurement process including setting the state of VSWR generator 104, gathering measurements from power detector 108 and setting the value of adjustable termination impedance 106 to achieve a high directivity, and performing various calculations described herein to support the measurement and calibration of directional coupler 102. In some embodiments, controller 172 may be implemented, for example, using a processor, microcontroller, or dedicated system logic.

FIG. 5*a* illustrates an adjustable impedance 200 that may be used to implement the various adjustable impedances disclosed herein. As shown, adjustable impedance 200 includes resistors R21, R22 and R23 coupled in series with each other. In addition, switch S21 is configured to bypass resistor R21, switch S22 is configured to bypass resistor R22 and switch S23 is configured to bypass R23. During operation switches S21, S22 and S23 are turned on and off in various combinations in order to provide an adjustable resistance value. When switches S21, S22 and S23 are all turned off, tunable adjustable impedance 200 has a maximum resistance value that may be decreased and adjusted by selectively turning on and off switches S21, S22 and S23 to effect a change in resistance.

FIG. 5*b* illustrates an adjustable impedance 210 that may also be used to implement the various adjustable impedances disclosed herein. As shown, adjustable impedance 210 includes resistors R31, R32 and R33 coupled in parallel with each other, such that each one of resistors R31, R32 and R33 are coupled in series with switches S31, S32 and S33, respectively. The resistance of adjustable impedance 210 may be adjusted selectively turning on and off switches S31, S32 and S33. In embodiments of the present invention, switches used in adjustable impedances 200 and 210 may be implemented using switching transistors known in the art. For example, these switches may be implemented using MOSFETS such as NMOS and PMOS devices or other suitable devices. It should be further understood that the topologies of adjustable impedances 200 and 210 are just two examples of many possible adjustable impedance topologies. For example, in some embodiments, greater or fewer than three resistors may be used. In some embodiments, a combination of series and parallel resistors branches may also be used. Alternatively, other adjustable impedance topologies known in the art may be used.

FIG. 6 illustrates directivity system 220 that includes the directivity system of FIG. 1*a* with the further addition of bypass switch 222 that is coupled to power detector 108. As shown, bypass switch 222 is configured to select either the output of power detector 108 or the coupled port of directional coupler 102. In some embodiments, the coupled port may be selected in order to make direct RF measurements of the coupled port of directional coupler 102 or the output of power detector 108 may be selected to obtain a DC and/or digital value that is proportional to the average power at the coupled port of directional coupler 102.

Figure 7A:
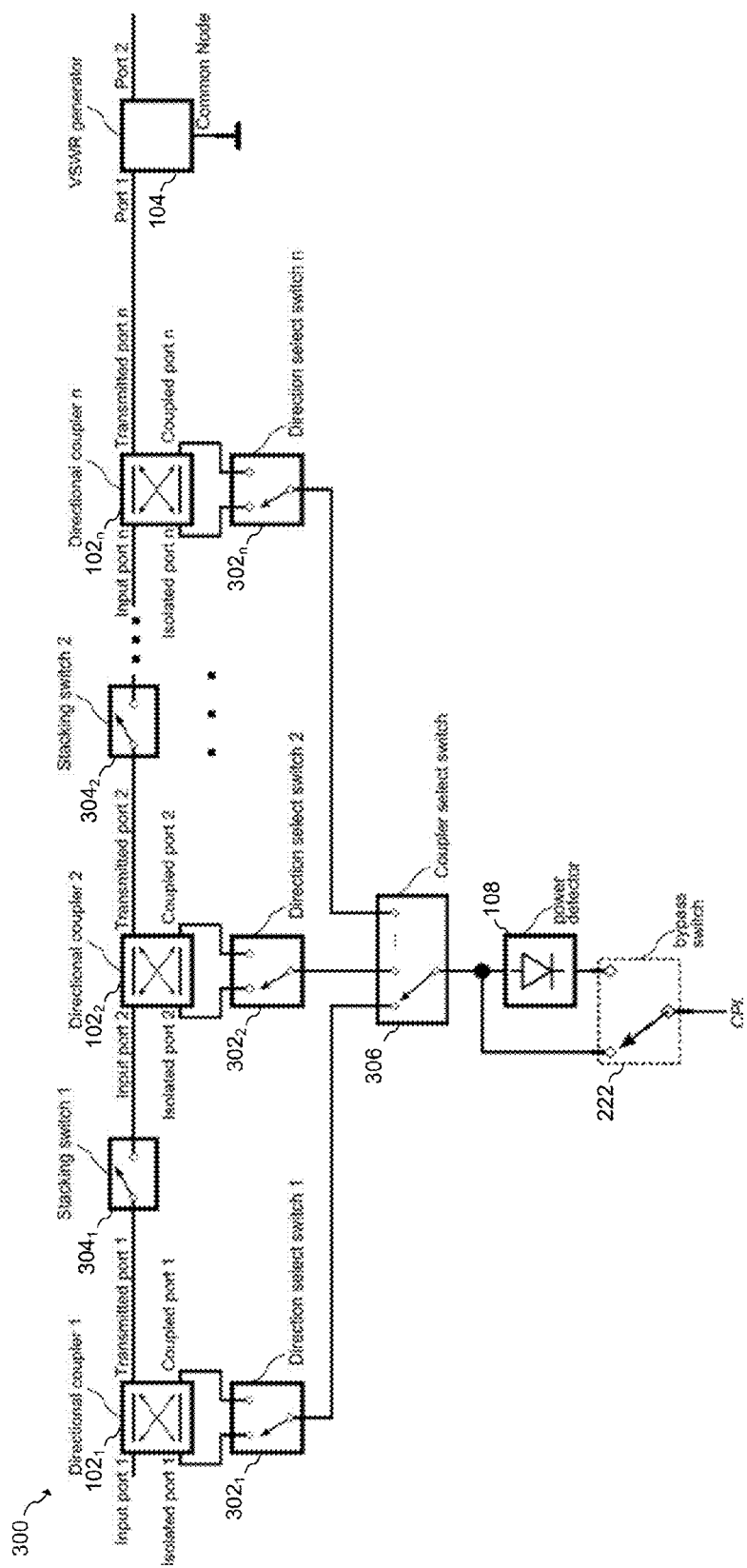
FIGS. 7a and 7b illustrate embodiment directivity measurement systems having a plurality of directional couplers.

FIG. 7*a* illustrates directivity system 300 that has n directional couplers 102₁, 102₂ to 102n coupled in series. Direction select switches 302₁, 302₂ to 302ₙ in conjunction with coupler select switch 306 selects an isolated port or a coupled port from one of the directional couplers 102₁, 102₂ to 102n for measurement using power detector 108. Accordingly, power detector 108 may be used to measure power in either the forward direction or the reverse direction in each of directional couplers 102₁, 102₂ to 102n. Stacking switches 304₁ and 304₂ are connected between each directional coupler 102₁, 102₂ to 102n in order to allow for independent connection to separate signal paths during normal operation and series coupling during calibration. These stacking switches 304₁ and 304₂ may be implemented on the same integrated circuit as directional couplers 302₁, 302₂ to 302ₙ. Alternatively, stacking switches 304₁ and 304₂ may be implemented on the test board on which the integrated circuit is mounted for testing. During calibration, an RF signal is applied to input port 1 of directional coupler 102₁ and the RF signal propagates along the stacked structure. VSWR generator 104 provides different loads as described above. One coupler may be selected at a time to perform directivity measurements and bypass switch allows power detector 108 to be bypassed during test, measurement and/or calibration. The stacking switch may be integrated on the same die with the rest of the elements of the system or may be implemented externally.

Figure 7B:
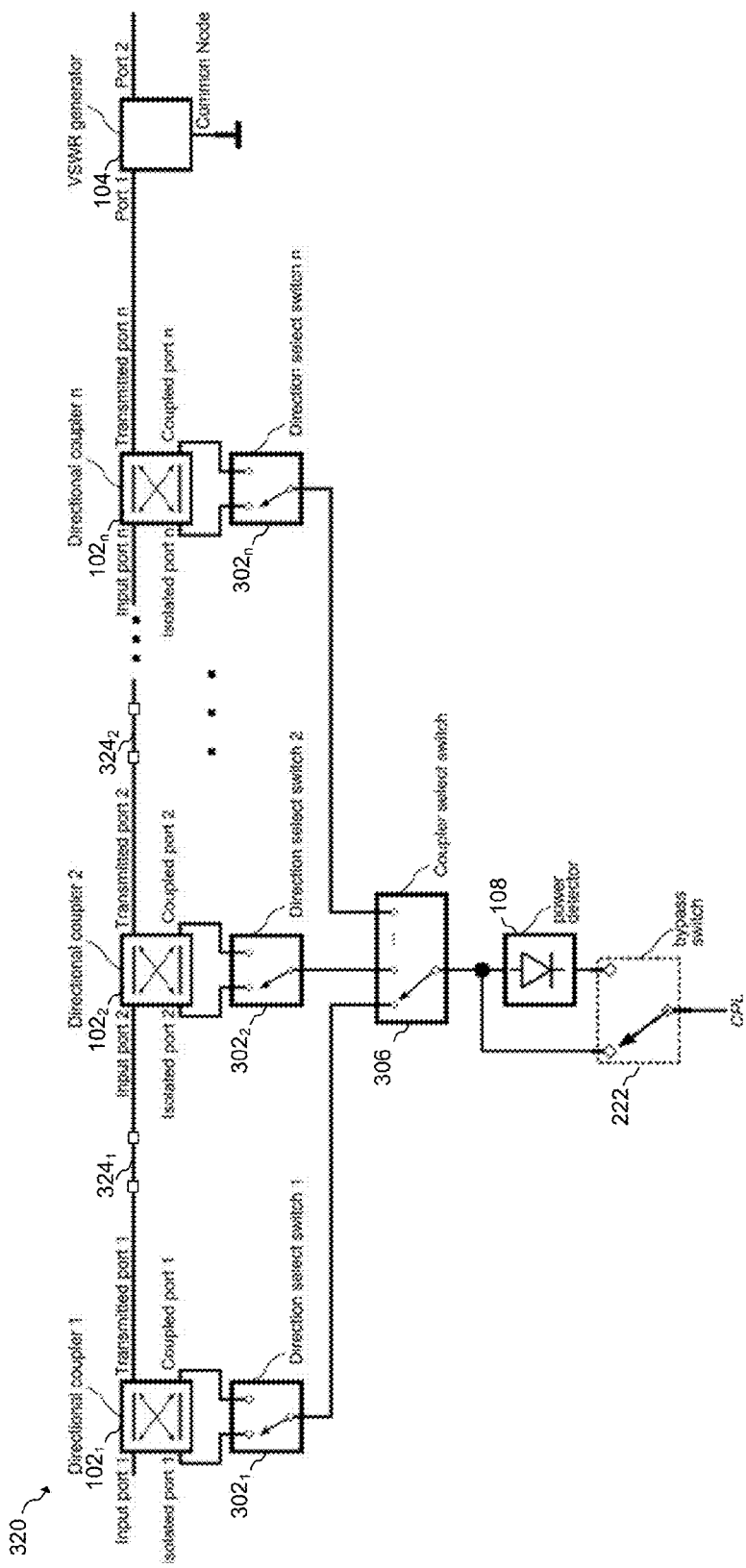

FIG. 7*b* illustrates directivity system 320, which it similar to directivity system 300 shown in FIG. 7*a*, but has the stacking switches replaced by electrical shorts 324₁ and 324₂. In some embodiments, these electrical shorts 324₁ and 324₂ are implemented, for example on a test board.

Figure 8A:
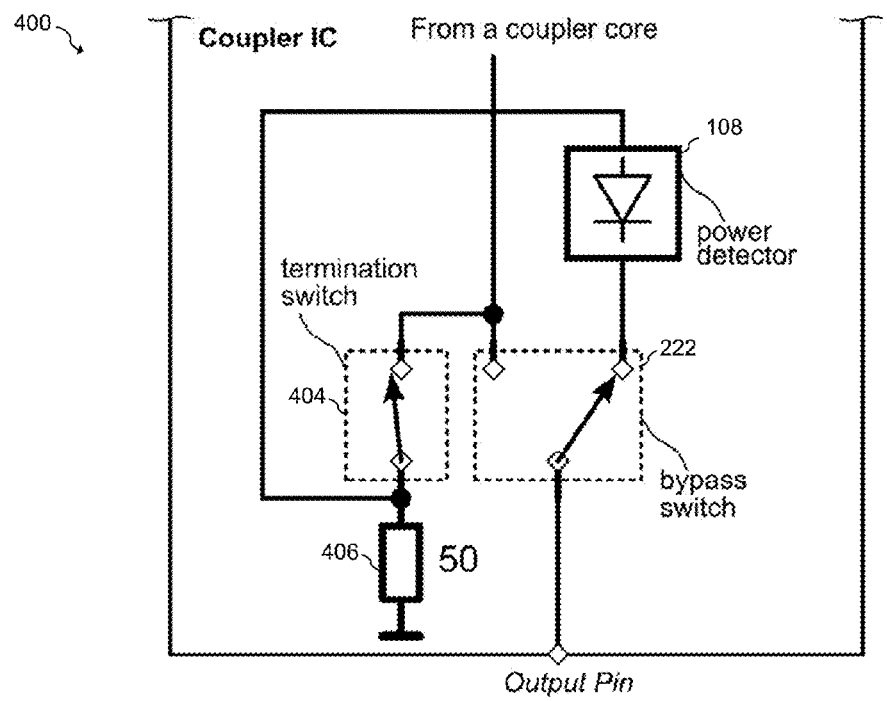
FIGS. 8a-8d illustrate an embodiment test interface for a directivity measurement system.

FIG. 8*a* illustrates an embodiment test interface 400 for a directivity measurement system that includes power detector 108 and bypass switch 222 as described above. In addition, embodiment test interface 400 includes a switchable termination including termination switch 404 and termination resistor 406. In an embodiment, termination resistor 406 is coupled to the isolated and/or coupled port of a directional coupler when power detector 108 performs a power measurement and left disconnected when an external load is applied to the output pin during a bypassed RF measurement. By using bypass switch 222, a single pin may be used to measure both a direct RF output and a DC power detector output.

Figure 8B:
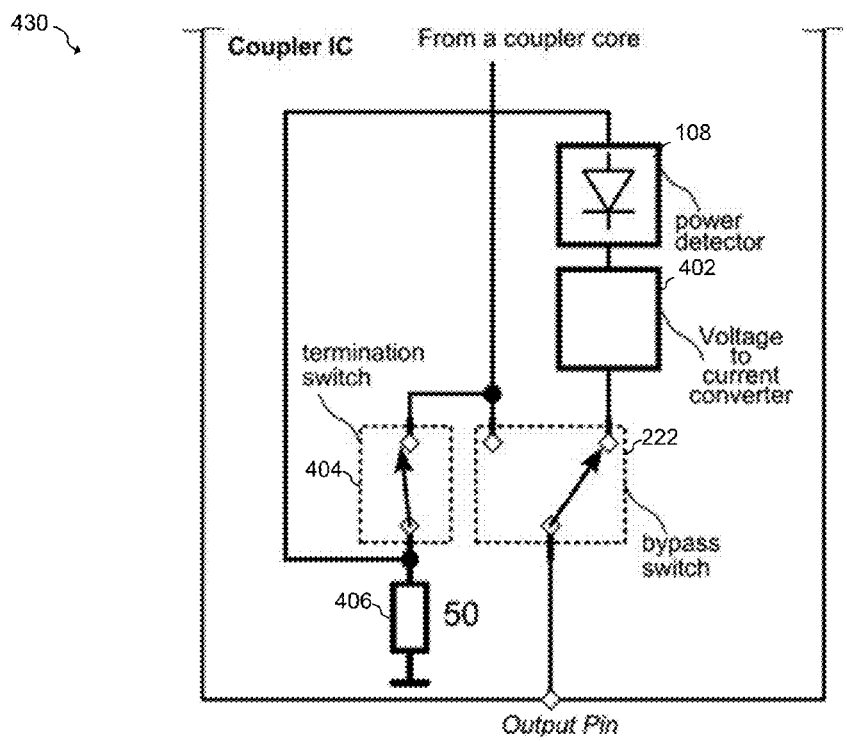

FIG. 8*b* illustrates an embodiment test interface 430 for a directivity measurement that is similar to test interface 400 shown in FIG. 8*a* with the addition of voltage to current converter 402 coupled between power detector 108 and bypass switch 222. Voltage-to-current converter 402 provides a current output of power detector 108 in order to enable test equipment to provide a low voltage and/or zero voltage at the output pin. Using such a low voltage at the output pin avoids stressing device structures, such as the NMOS gate dielectric on the coupler IC. In alternative embodiments, power detector 108 may be implemented with a circuit that provides a current-mode output, in which case voltage-to-current converter 402 may be omitted.

Figures 8C, 8D:
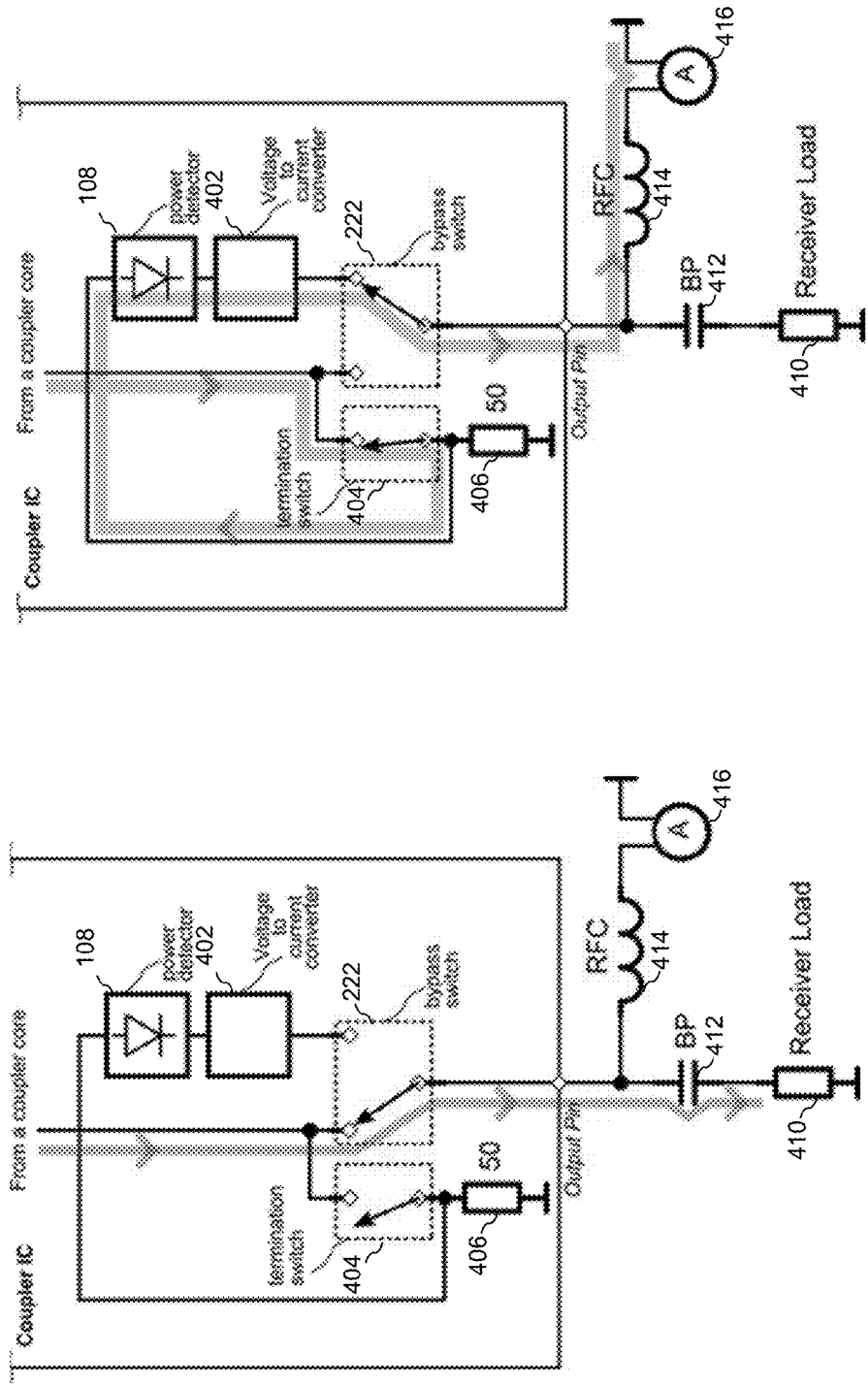

FIG. 8c illustrates an embodiment test configuration of embodiment test interface 430 where the directivity system is configured to provide a bypassed RF measurement to the output pin. As shown, bypass switch 222 routes the coupler core to the output pin, which is coupled to bypass capacitor 412 and receiver load 410. Termination resistor 406 is disconnected from the output pin by termination switch 404. As shown an RF signal path is formed directly from the coupler core to receiver load 410. RF choke 414 provides a high RF impedance to current measuring device 416.

FIG. 8d illustrates an embodiment test configuration of embodiment test interface 430 when the directivity system is configured to provide a current mode DC measurement. As shown, bypass switch 222 routes the output of voltage-to-current converter 402 to the output pin, which is coupled to bypass capacitor 412 and receiver load 410. Termination resistor 406 is connected to the coupler core via termination switch 404. As shown, an RF signal path is formed from the coupler core to termination resistor 406 and the input to power detector 108. The output of power detector 108 provides a voltage that is proportional to the power output of the directional coupler. This voltage is converted to a current via voltage-to-current converter 402 and provided to current measuring device 416 via RF choke 414. Current measuring device 416 may be implemented using current measuring circuits and systems known in the art. For example, current measuring device 416 may be implemented using an ammeter or a shunt resistor having a small value.

Figure 9A:
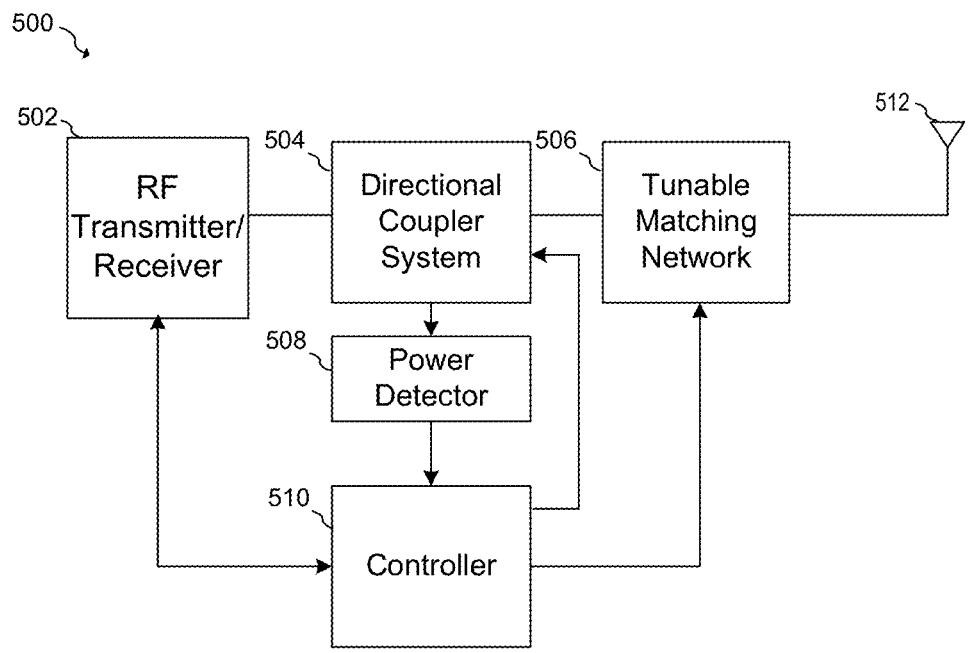
FIGS. 9a-9d illustrate RF systems that utilize embodiment directional coupler systems.
Figure 9B:
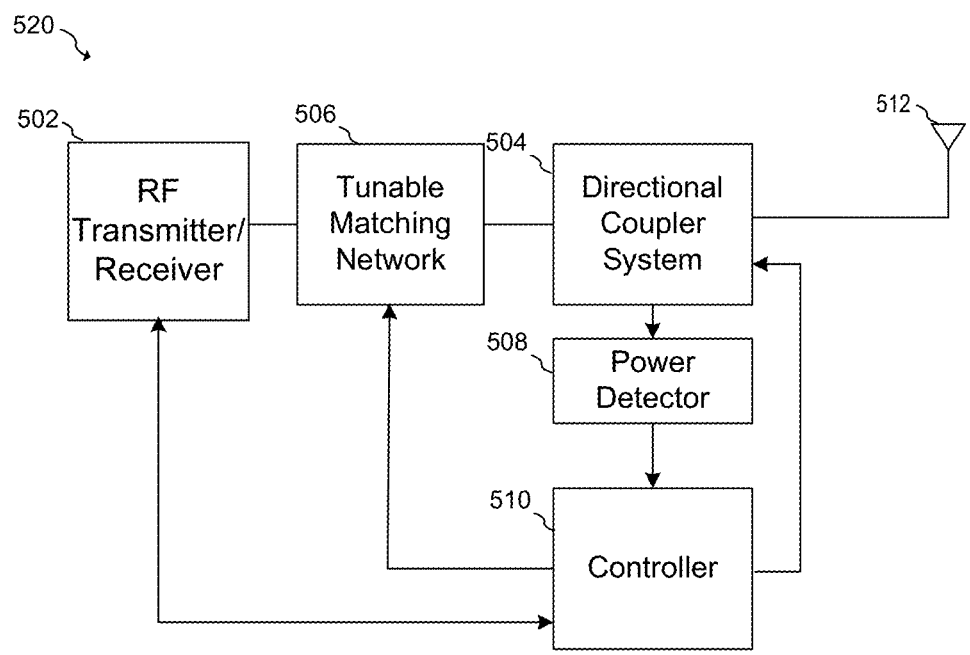

FIG. 9a illustrates RF system 500 according to an embodiment of the present invention. System 500 includes RF transceiver 502 coupled to antenna 512 via embodiment directional coupler system 504 and tunable matching network 506. The output port of directional coupler 504 is coupled to power detector 508, the output of which is coupled to controller 510. In an embodiment, controller 510 adjusts tunable matching network 506 according to the digitized output of power detector 508. When directional coupler 504 detects an impedance mismatch between the RF transceiver 502 and the input to tunable matching network 506, controller 510 adjusts tunable matching network 506 until the measured its mismatch in impedance falls below a predetermined threshold in some embodiments. In some embodiments, controller 510 may be implemented, for example, using a processor, microcontroller, or dedicated system logic. During operation, controller 510 selects which output port of the directional coupler is routed to power detector 508 depending on the measurement being made. RF system 500 may be implemented, for example, in the front end of a cellular telephone, wireless local area network transceiver, or other radio frequency system. In some embodiments, tunable matching network 506 is coupled between RF transceiver 502 and directional coupler 504, as shown in FIG. 9b with respect to system 520.

Figure 9C:
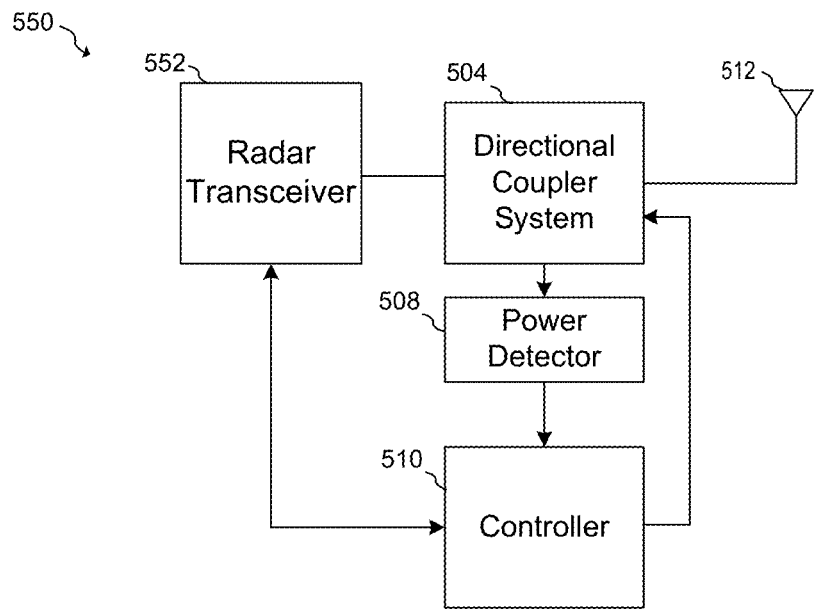

FIG. 9c illustrates embodiment radar system 550 according to another embodiment of the present invention. System 550 includes radar transceiver 552 coupled to antenna 512 via embodiment directional coupler system 504. The output of directional coupler system 504 is coupled to the controller 510 via power detector 508. In an embodiment, directional coupler system 504 measures an incident signal from antenna 512 that may represent a reflected radar pulse. System 550 may be used, for example, a radar system such as automotive or proximity radar systems. Directional coupler system 504 may be implemented, for example, using embodiment directional couplers systems disclosed herein. Other example systems that may utilize embodiment reflection measurement circuits include power monitoring in planar inverted F antenna (PIFA) feed-point tuners.

Figure 9D:
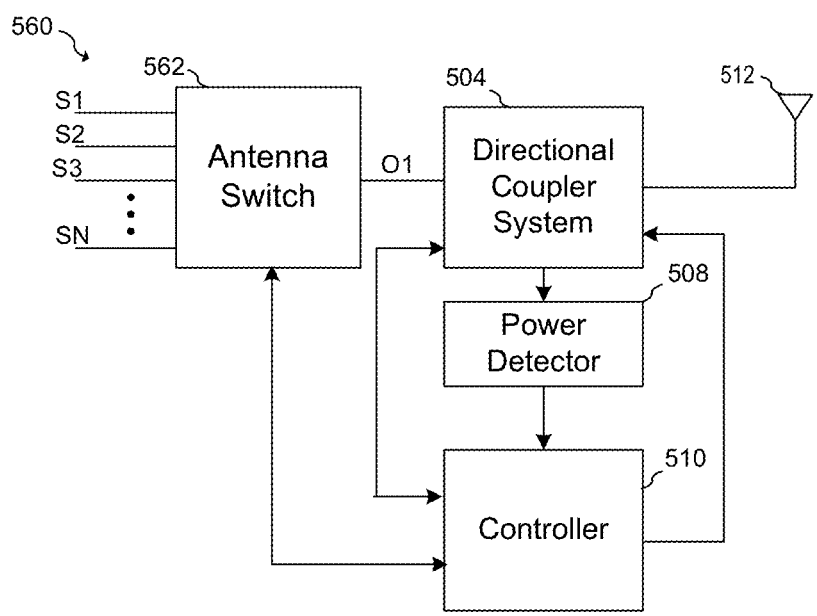

FIG. 9d illustrates embodiment system 560 that includes antenna switch 562 coupled to antenna 512 via embodiment directional coupler system 504. Antenna switch 562 is configured to select and couple one input from among inputs 51 through SN to output node O1. The output port of directional coupler 504 is coupled to controller 510 via power detector 508. System 560 may be used, for example, to measure transmitted and reflected power in the forward and reverse direction by selecting a position of the polarity switch within directional coupler 504. The output of directional coupler 504 may be further used to perform envelope tracking and antenna tuning.

It should be appreciated that the embodiment shown in FIGS. 9a-d are just four examples of the many embodiment systems that may be implemented using embodiment directional couplers.

Figure 10:
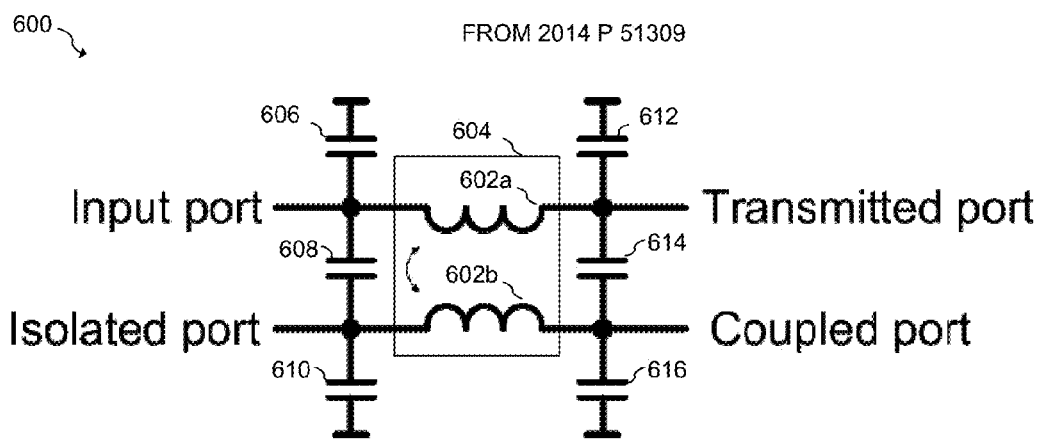
FIG. 10 illustrates a schematic of an embodiment directional coupler.

FIG. 10 illustrates directional coupler 600 that may be used to implement directional couplers in various embodiments. As shown, directional coupler 600 is implemented using transformer 604 with one winding 602a coupled between the input port and the transmitted port, and another winding 602b coupled between the isolated port and the coupled port and magnetically coupled to winding 602a. Transformer 604 may be implemented using circuits and systems known in the art. For example, in one embodiment, transformer 604 may be implemented using stacked or adjacent spiral inductors disposed on an integrated circuit. In a further embodiment, transformer 604 may be implemented using a stripline transformer disposed on a substrate. Alternatively, other structures may be used. In an embodiment, capacitors 606, 608, 610, 612, 614 and 616 are coupled to transformer 604.

Figure 11A:
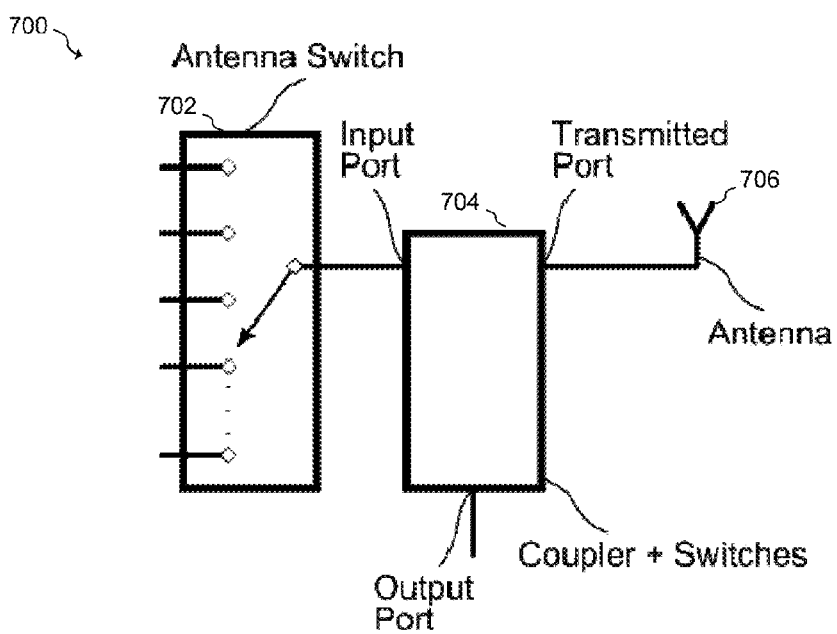
FIGS. 11a-11c illustrate further RF systems that utilize embodiment directional coupler systems.
Figure 11B:
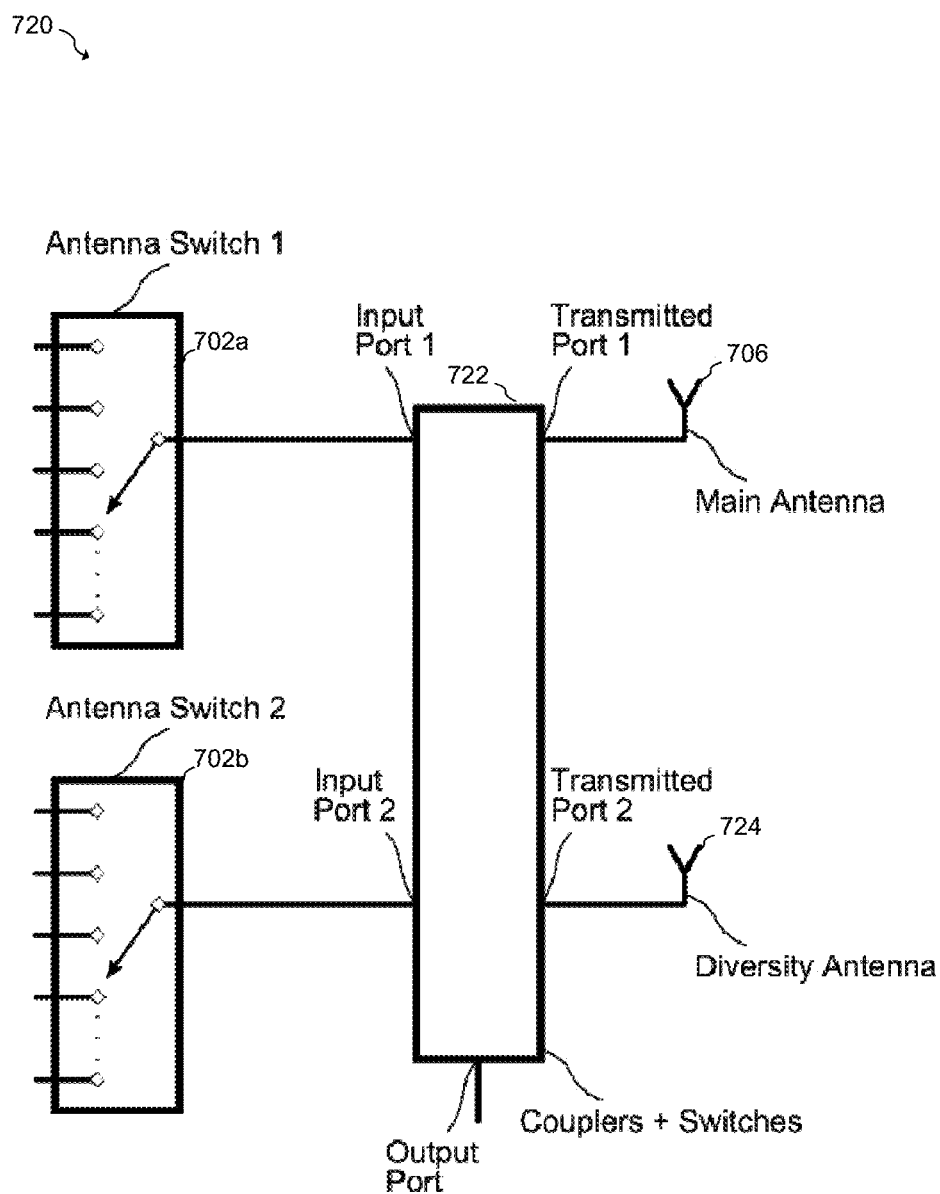
Figure 11C:
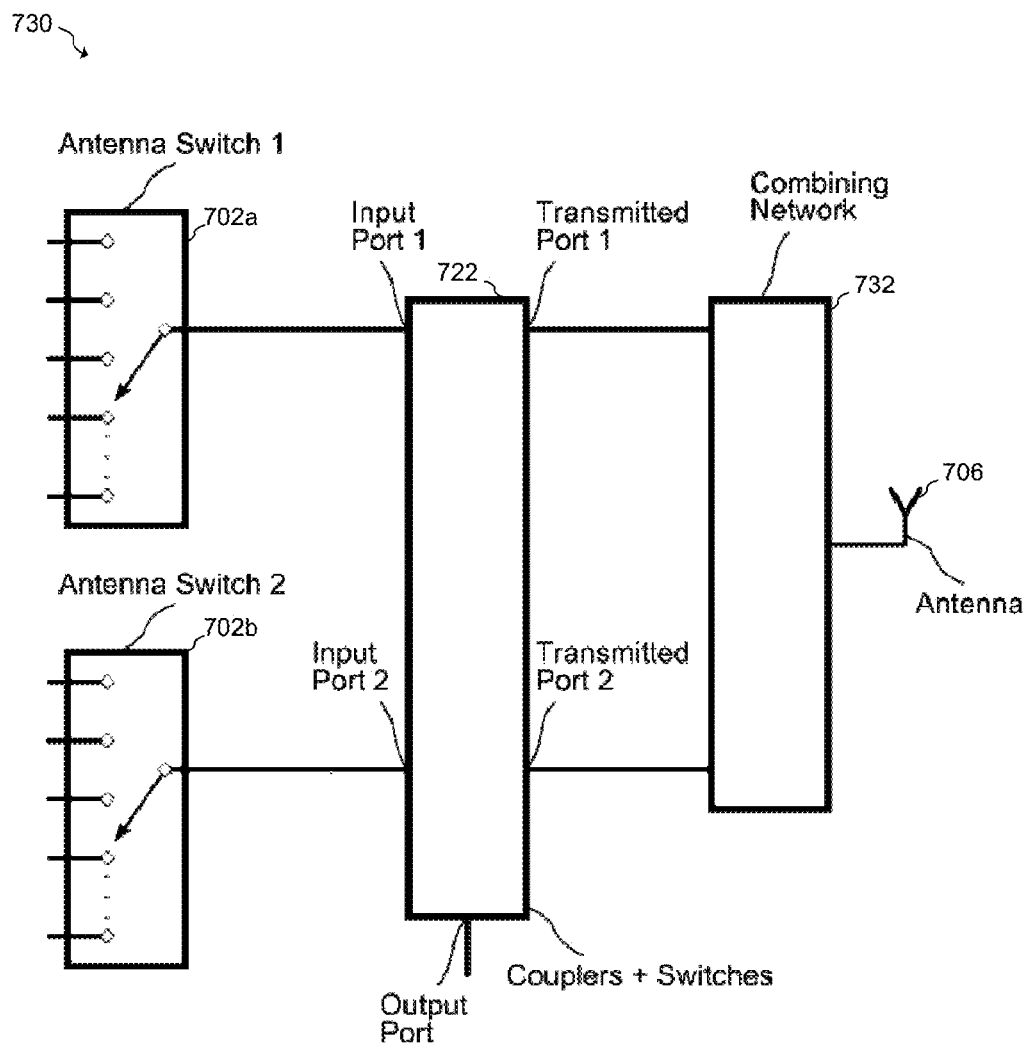

FIGS. 11a-11c illustrate various RF systems that utilize embodiment directional coupler systems. For example, FIG. 11a illustrates antenna system 700 that couples multiple channels from an RF front end to antenna 706 via antenna switch 702 and embodiment directional coupler system 704. Antenna switch 702 selects one from among a plurality of RF front-end input ports, and directional coupler system 704 provides access to coupled signals at its output port. Directional coupler system 704 may be implemented according to various embodiments described herein. In an embodiment, antenna system 700 may be incorporated within a portable RF device such as a cellular telephone. By selecting among various RF paths using antenna switch 702 a multi-standard cellular telephone may be supported. Embodiment directional coupler system 722 may be used for example to select among various coupled measurement paths in order to perform transmitted and reflected power measurements during system operation.

FIG. 11b illustrates embodiment antenna system 720 that may be used in an RF front-end system that uses multiple antennas. Antenna system 720 includes antenna switches 702a and 702b, embodiment directional coupler system 722 and antennas 706 and 724. In one embodiment, antenna 706 is configured as a main antenna and antenna 724 is configured as a diversity antenna. In an embodiment, directional coupler system 722 may be implemented using embodiment directional coupler system that utilizes a plurality of directional couplers in order to support simultaneous transmission of two signals to antennas 706 and 724.

FIG. 11c illustrates antenna system 730 that includes antenna switches 702a and 702b, embodiment directional coupler system 722, combining network 732 antenna 706. Here, antenna switch 702a selects one signal from among multiple signals in a first RF path and 702b selects one signal from among multiple signals in a second RF path. These two RF paths are combined via combining network 732 that may be implemented, using an RF power combiner, a diplexer, or other circuit known in the art. The output port of directional coupler system 722 may be coupled to a power detector (not shown) in order to measure the transmitted and reflected power in each of the various RF paths.

In accordance with various embodiments, circuits or systems may be configured to perform particular operations or actions by virtue of having software, firmware, hardware, or a combination of them installed on the system that in operation causes or cause the system to perform the actions. One general aspect includes a method of operating a directional coupler by determining a coupled power variation by applying an input signal at an input port of the directional coupler, applying a first impedance at a transmitted port of the directional coupler, measuring a first coupled power at a coupled port of the directional coupler after applying the first impedance, applying a second impedance at the transmitted port of the directional coupler, measuring a second coupled power after applying the second impedance, and determining a difference between the first coupled power and the second coupled power to form the coupled power variation. Other embodiments of this aspect include corresponding circuits and systems configured to perform the various actions of the methods.

Implementations may include one or more of the following features. The method may further include adjusting a termination impedance coupled to an isolated port of the directional coupler when the coupled power variation exceeds a predetermined threshold and/or repeating the determining the coupled variation and the adjusting the termination impedance until the coupled power variation does not exceed the predetermined threshold.

In an embodiment, measuring the first coupled power and measuring the second coupled power includes using a power detector circuit. Using the power detector circuit may include producing a voltage at an output of the power detector circuit and converting the voltage at the output of the power detector circuit to a current. In an embodiment, applying the first impedance includes open circuiting the transmitted port of the directional coupler, and applying the second impedance includes short circuiting the transmitted port of the directional coupler. In some embodiments, applying the first impedance includes short circuiting the transmitted port of the directional coupler and applying the second impedance includes open circuiting the transmitted port of the directional coupler.

In an embodiment, the method further including determining a directivity of the directional coupler based on the coupled power variation. Determining the directivity may include determining the directivity according to:

$$DIR = 20\log\left|\frac{VSWR-1}{VSWR+1} \cdot \frac{10^{\frac{\delta_{pk-pk}}{20}}+1}{10^{\frac{\delta_{pk-pk}}{20}}-1}\right|,$$

where DIR is the directivity of the directional coupler, $\delta_{pk-pk}$ is the coupled power variation and VSWR is a voltage standing wave ratio.

In an embodiment, the method further including determining a reflected power variation by applying the input signal at an input port of the directional coupler, applying the first impedance at a transmitted port of the directional coupler, measuring a first reflected power at an isolated port of the directional coupler after applying the first impedance, applying the second impedance at the transmitted port of the directional coupler, measuring a second reflected power after applying the second impedance, and determining a difference between the first reflected power and the reflected coupled power to form the reflected power variation.

In some embodiments, the method further including adjusting a termination impedance coupled to the coupled port of the directional coupler when the reflected power variation exceeds a predetermined threshold. The method may further include repeating the determining the reflected variation and the adjusting the termination impedance until the coupled power variation does not exceed the predetermined threshold.

In an embodiment, the method further includes applying a third impedance at the transmitted port of the directional coupler; and measuring a third coupled power after applying the second impedance. The method may also include calculating a first directivity based on measuring the first coupled power and the second coupled power; calculating a second directivity based on measuring the first coupled power and the third coupled power; and determining an averaged directivity by averaging the first directivity and the second directivity. The first impedance may include a matched impedance; the second impedance may include an open circuit; and the third impedance may include a short circuit. Implementations of the described techniques may include hardware, a method or process, or computer software on a computer-accessible medium.

Another general aspect includes a directional coupler system including a directional coupler; a power detector coupled to a coupled port of the directional coupler; and a switchable impedance circuit coupled to a transmitted port of the directional coupler, the switchable impedance circuit configured to switchably apply a first impedance to the transmitted port and a second impedance to the transmitted port according to a control input.

Implementations may include one or more of the following features. The directional coupler system further including a controller coupled to the control input of the switchable impedance circuit and to an output of the power detector, and controller is configured to apply the first impedance at the transmitted port of the directional coupler via the switchable impedance circuit, measure a first coupled power at the coupled port of the directional coupler after applying the first impedance via the power detector, apply the second impedance at the transmitted port of the directional coupler via the switchable impedance circuit, measure a second coupled power after applying the second impedance via the power detector, and determine a difference between the first coupled power and the second coupled power to form a coupled power variation.

In some embodiments, the directional coupler system further includes a first adjustable termination impedance coupled to the coupled port of the directional coupler. The directional coupler system may further including a controller coupled to a the control input of the switchable impedance circuit and to an output of the power detector, and the controller configured to: determine a coupled power variation by applying the first impedance at the transmitted port of the directional coupler via the switchable impedance circuit, measuring a first coupled power at the coupled port of the directional coupler after applying the first impedance via the power detector, applying the second impedance at the transmitted port of the directional coupler via the switchable impedance circuit, measuring a second coupled power after applying the second impedance via the power detector, and determining a difference between the first coupled power and the second coupled power to form the coupled power variation. The controller is also configured to adjust the first adjustable termination impedance when the coupled power variation exceeds a first predetermined threshold and repeat the determining the coupled variation and the adjusting the first adjustable termination impedance until the coupled power variation does not exceed the first predetermined threshold.

The directional coupler system may include a second adjustable termination impedance coupled to the coupled port of the directional coupler, where the controller is further configured to: determine a reflected power variation by applying the first impedance at the transmitted port of the directional coupler via the switchable impedance circuit, measuring a first reflected power at an isolated port of the directional coupler after applying the first impedance via the power detector, applying the second impedance at the transmitted port of the directional coupler via the switchable impedance circuit, measuring a second reflected power after applying the second impedance via the power detector, and determining a difference between the first reflected power and the second reflected power to form the reflected power variation. The controller is also configured to adjust the second adjustable termination impedance when the reflected power variation exceeds a second predetermined threshold and repeat the determining the coupled variation and the adjusting the second adjustable termination impedance until the coupled power variation does not exceed the second predetermined threshold.

In an embodiment, the directional coupler system further includes an output selection switch configured to route one of a direct output of the coupled port of the directional coupler and an output of the voltage to current converter to an output pin. The directional coupler may also include a termination impedance coupled to an input of the power detector, and a termination switch coupled between the input of the power detector and the direct output of the coupled port of the directional coupler. In some embodiments, the directional coupler system further includes a voltage to current converter coupled between an output of the power detector and the output selection switch. The directional coupler, the power detector and the switchable impedance circuit may be disposed on a same integrated circuit in some embodiments. Implementations of the described techniques may include hardware, a method or process, or computer software on a computer-accessible medium.

A further general aspect includes a circuit having a first directional coupler including a first input port, a first transmitted port, a first isolated port and a first coupled port; and a second directional coupler including a second input port coupled to the first transmitted port of the first directional coupler, a second transmitted port, a second isolated port and a second coupled port. The circuit also includes a switchable impedance circuit coupled to the second transmitted port of the second directional coupler, where the switchable impedance circuit configured to switchably apply a first impedance to the second transmitted port and a second impedance to the second transmitted port. The circuit further includes a switching network configured to route one of the first isolated port, the first coupled port, the second isolated port and the second coupled port to an output of the switching network, a power detector coupled to the output of the switching network, and a bypass switch configured to route one of the output of the switching network and the output of the power detector to an output pin.

In an embodiment, the circuit further includes a first stacking switch coupled between the first transmitted port and the second input port. The circuit may also include at least one further directional coupler coupled between the second transmitted port and the switchable impedance circuit, wherein the switching network is further configured to route one an isolated port and a coupled port of the at least one further directional coupled to the output of the switching network.

In an embodiment, the circuit includes a controller configured to select one of the first isolated port, the first coupled port, the second isolated port and the second coupled via the switching network, apply the first impedance via the switchable impedance circuit, measure a first power at the output of the switching network via the power detector, apply the second impedance via the switchable impedance circuit, measure a second power at the output of the switching network via the power detector, and determine a difference between the first power and the second power. In some embodiments, the first directional coupler, the second directional coupler, the switchable impedance circuit, the switching network and the power detector are disposed on a same integrated circuit.

Advantages of some embodiment directional couplers include the ability to determine directivity of a directional coupler using power detectors in which the return loss of the coupler at the transmitted port does not need to be below the target directivity of the directional coupler. A further advantage of some embodiments includes the ability to use a less sensitive power detector while measuring power at a coupled port. A further advantage includes the ability to share a single pin of an integrated circuit to output both an RF coupled signal as well as a DC signal indicating a power measured by an internal power detector.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of operating a directional coupler, the method comprising:
   determining a coupled power variation by
      applying an input signal at an input port of the directional coupler,
      applying a first impedance at a transmitted port of the directional coupler,
      measuring a first coupled power at a coupled port of the directional coupler after applying the first impedance,
      applying a second impedance at the transmitted port of the directional coupler, wherein the second impedance is different from the first impedance,
      measuring a second coupled power at the coupled port of the directional coupler after applying the second impedance,
      determining a difference between the first coupled power and the second coupled power to form the coupled power variation, wherein the directional coupler is configured to provide to the coupled port of the directional coupler a first signal proportional to a first radio frequency (RF) signal propagating from the input port of the directional coupler to the transmitted port of the directional coupler, and is configured to provide to an isolated port of the directional coupler a second signal proportional to a second RF signal propagating from the transmitted port of the directional coupler to the input port of the directional coupler; and adjusting a termination impedance coupled to the isolated port of the directional coupler when the coupled power variation exceeds a predetermined threshold.

2. The method of claim 1, further comprising repeating the determining the coupled power variation and the adjusting the termination impedance until the coupled power variation does not exceed the predetermined threshold.

3. The method of claim 1, wherein measuring the first coupled power and measuring the second coupled power comprises using a power detector circuit.

4. The method of claim 3, wherein using the power detector circuit comprises producing a voltage at an output of the power detector circuit and converting the voltage at the output of the power detector circuit to a current.

5. The method of claim 1, wherein:
applying the first impedance comprises open circuiting the transmitted port of the directional coupler; and
applying the second impedance comprises short circuiting the transmitted port of the directional coupler.

6. The method of claim 1, wherein:
applying the first impedance comprises short circuiting the transmitted port of the directional coupler; and
applying the second impedance comprises open circuiting the transmitted port of the directional coupler.

7. The method of claim 1, further comprising determining a directivity of the directional coupler based on the coupled power variation.

8. The method of claim 7, wherein determining the directivity comprises determining the directivity according to:

$$DIR = 20\log\left(\frac{VSWR-1}{VSWR+1} \cdot \frac{10^{\frac{\delta_{pk-pk}}{20}}+1}{10^{\frac{\delta_{pk-pk}}{20}}-1}\right),$$

where DIR is the directivity of the directional coupler, $\delta_{pk-pk}$ is the coupled power variation and VSWR is a voltage standing wave ratio.

9. The method of claim 1, further comprising determining a reflected power variation by:
applying the input signal at an input port of the directional coupler,
applying the first impedance at a transmitted port of the directional coupler,
measuring a first reflected power at the isolated port of the directional coupler after applying the first impedance,
applying the second impedance at the transmitted port of the directional coupler,
measuring a second reflected power after applying the second impedance, and
determining a difference between the first reflected power and the second reflected power to form the reflected power variation.

10. The method of claim 9, further comprising adjusting a termination impedance coupled to the coupled port of the directional coupler when the reflected power variation exceeds a predetermined threshold.

11. The method of claim 10, further comprising repeating the determining the reflected power variation and the adjusting the termination impedance until the coupled power variation does not exceed the predetermined threshold.

12. The method of claim 1, further comprising:
applying a third impedance at the transmitted port of the directional coupler; and
measuring a third coupled power after applying the second impedance.

13. The method of claim 12, further comprising:
calculating a first directivity based on measuring the first coupled power and the second coupled power;
calculating a second directivity based on measuring the first coupled power and the third coupled power; and
determining an averaged directivity by averaging the first directivity and the second directivity.

14. The method of claim 13, wherein:
the first impedance comprises a matched impedance;
the second impedance comprises an open circuit; and
the third impedance comprises a short circuit.

15. A directional coupler system comprising:
a directional coupler, wherein the directional coupler is configured to provide to a coupled port of the directional coupler a first signal proportional to a first radio frequency (RF) signal propagating from an input port of the directional coupler to a transmitted port of the directional coupler, and is configured to provide to an isolated port of the directional coupler a second signal proportional to a second RF signal propagating from the transmitted port of the directional coupler to the input port of the directional coupler;
a power detector coupled to the coupled port of the directional coupler;
a switchable impedance circuit operatively coupled to the transmitted port of the directional coupler, the switchable impedance circuit configured to switchably apply a first impedance to the transmitted port and a second impedance to the transmitted port according to a control input; and
an output selection switch configured to route one of a direct output of the coupled port of the directional coupler and an output of the power detector to an output pin.

16. The directional coupler system of claim 15, further comprising:
a controller coupled to the control input of the switchable impedance circuit and to an output of the power detector, the controller configured to:
apply the first impedance at the transmitted port of the directional coupler via the switchable impedance circuit,
measure a first coupled power at the coupled port of the directional coupler after applying the first impedance via the power detector,
apply the second impedance at the transmitted port of the directional coupler via the switchable impedance circuit,
measure a second coupled power after applying the second impedance via the power detector, and
determine a difference between the first coupled power and the second coupled power to form a coupled power variation.

17. The directional coupler system of claim 15, further comprising a first adjustable termination impedance coupled to the coupled port of the directional coupler.

18. The directional coupler system of claim 17, further comprising a controller coupled to the control input of the switchable impedance circuit and to an output of the power detector, the controller configured to:
  determine a coupled power variation by
    applying the first impedance at the transmitted port of the directional coupler via the switchable impedance circuit,
    measuring a first coupled power at the coupled port of the directional coupler after applying the first impedance via the power detector,
    applying the second impedance at the transmitted port of the directional coupler via the switchable impedance circuit,
    measuring a second coupled power after applying the second impedance via the power detector, and
    determining a difference between the first coupled power and the second coupled power to form the coupled power variation;
  adjust the first adjustable termination impedance when the coupled power variation exceeds a first predetermined threshold; and
  repeat the determining the coupled power variation and the adjusting the first adjustable termination impedance until the coupled power variation does not exceed the first predetermined threshold.

19. The directional coupler system of claim 15, further comprising:
  a voltage to current converter coupled between the output of the power detector and the output selection switch.

20. The directional coupler of claim 15, further comprising:
  a termination impedance coupled to an input of the power detector; and
  a termination switch coupled between the input of the power detector and the direct output of the coupled port of the directional coupler.

21. A circuit comprising:
  a first directional coupler comprising a first input port, a first transmitted port, a first isolated port and a first coupled port; and
  a second directional coupler comprising a second input port coupled to the first transmitted port of the first directional coupler, a second transmitted port, a second isolated port and a second coupled port;
  a switchable impedance circuit coupled to the second transmitted port of the second directional coupler, the switchable impedance circuit configured to switchably apply a first impedance to the second transmitted port and a second impedance to the second transmitted port;
  a switching network configured to route one of the first isolated port, the first coupled port, the second isolated port and the second coupled port to an output of the switching network;
  a power detector coupled to the output of the switching network; and
  a bypass switch configured to route one of the output of the switching network and the output of the power detector to an output pin.

22. The circuit of claim 21, further comprising a first stacking switch coupled between the first transmitted port and the second input port.

23. The circuit of claim 21, further comprising at least one further directional coupler coupled between the second transmitted port and the switchable impedance circuit, wherein the switching network is further configured to route one an isolated port and a coupled port of the at least one further directional coupled to the output of the switching network.

24. The circuit of claim 21, further comprising a controller configured to:
  select one of the first isolated port, the first coupled port, the second isolated port and the second coupled port via the switching network;
  apply the first impedance via the switchable impedance circuit;
  measure a first power at the output of the switching network via the power detector;
  apply the second impedance via the switchable impedance circuit;
  measure a second power at the output of the switching network via the power detector; and
  determine a difference between the first power and the second power.

25. The circuit of claim 21, wherein the first directional coupler, the second directional coupler, the switchable impedance circuit, the switching network and the power detector are disposed on a same integrated circuit.

26. A directional coupler system comprising:
  a directional coupler, wherein the directional coupler is configured to provide to a coupled port of the directional coupler a first signal proportional to a first radio frequency (RF) signal propagating from an input port of the directional coupler to a transmitted port of the directional coupler, and is configured to provide to an isolated port of the directional coupler a second signal proportional to a second RF signal propagating from the transmitted port of the directional coupler to the input port of the directional coupler;
  a power detector coupled to the coupled port of the directional coupler;
  a switchable impedance circuit operatively coupled to the transmitted port of the directional coupler, the switchable impedance circuit configured to switchably apply a first impedance to the transmitted port and a second impedance to the transmitted port according to a control input; and
  a controller coupled to the directional coupler, the switchable impedance circuit and the power detector, the controller configured to
    determine a coupled power variation by
      applying an input signal at an input port of the directional coupler,
      applying a first impedance at the transmitted port of the directional coupler via the switchable impedance circuit,
      measuring a first coupled power at a coupled port of the directional coupler after applying the first impedance via the power detector,
      applying a second impedance at the transmitted port of the directional coupler, wherein the second impedance is different from the first impedance via the switchable impedance circuit,
      measuring a second coupled power at the coupled port of the directional coupler while after applying the second impedance via the power detector, and
      determining a difference between the first coupled power and the second coupled power to form the coupled power variation, and
    adjust a first termination impedance coupled to the isolated port of the directional coupler when the coupled power variation exceeds a predetermined threshold.

27. The directional coupler system of claim 26, wherein the controller is further configured to:
  determine a reflected power variation by
    applying the first impedance at the transmitted port of the directional coupler via the switchable impedance circuit,
    measuring a first reflected power at the isolated port of the directional coupler after applying the first impedance via the power detector,
    applying the second impedance at the transmitted port of the directional coupler via the switchable impedance circuit,
    measuring a second reflected power after applying the second impedance via the power detector, and
    determining a difference between the first reflected power and the second reflected power to form the reflected power variation;
  adjust a second adjustable termination impedance coupled to the coupled port of the directional coupler when the reflected power variation exceeds a second predetermined threshold; and
  repeat the determining the coupled power variation and the adjusting the second adjustable termination impedance until the coupled power variation does not exceed the second predetermined threshold.

28. The directional coupler system of claim 26, wherein the directional coupler, the power detector and the controller are disposed on a same integrated circuit.

* * * * *